United States Patent
Ganton

(10) Patent No.: US 6,360,435 B1
(45) Date of Patent: *Mar. 26, 2002

(54) BIDIRECTIONAL INTERFACE TOOL FOR PWB DEVELOPMENT

(75) Inventor: Robert B. Ganton, San Diego, CA (US)

(73) Assignee: Qualcomm Incorporated, San Diego, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/382,440

(22) Filed: Aug. 25, 1999

(51) Int. Cl.⁷ .................................................. H01R 3/10
(52) U.S. Cl. .......................... 29/852; 29/846; 174/261; 174/262; 361/780; 361/792; 439/44; 439/48
(58) Field of Search ................................ 174/261, 262, 174/267, 260, 36; 361/780, 792, 793, 794, 795; 439/65–70, 71–75, 44, 48; 29/857, 854

(56) References Cited

U.S. PATENT DOCUMENTS

| | | | | |
|---|---|---|---|---|
| 2,019,625 A | * | 11/1935 | O'Brien | 361/805 |
| 3,142,112 A | * | 7/1964 | Burkig et al. | 29/852 |
| 3,151,923 A | * | 10/1964 | Bell et al. | 439/48 |
| 3,492,627 A | * | 1/1970 | Taucher | 339/17 |
| 3,764,955 A | * | 10/1973 | Ward | 439/377 |
| 3,878,341 A | * | 4/1975 | Balde | 307/113 |
| 3,961,228 A | * | 6/1976 | Briggs et al. | 361/803 |
| 4,018,491 A | * | 4/1977 | Niedzwiecke et al. | 439/31 |
| 4,133,592 A | * | 1/1979 | Cobaugh et al. | 339/17 |
| 4,306,275 A | * | 12/1981 | Miura | 361/785 |
| 4,695,258 A | * | 9/1987 | Hanson et al. | 439/67 |
| 4,730,238 A | * | 3/1988 | Cook | 361/792 |
| 4,838,798 A | * | 6/1989 | Evans et al. | 439/61 |
| 4,869,676 A | * | 9/1989 | Demler, Jr. et al. | 439/79 |
| 4,878,847 A | * | 11/1989 | Rutledge | 439/74 |
| 4,897,054 A | * | 1/1990 | Gilissen et al. | 439/631 |
| 4,907,127 A | * | 3/1990 | Lee | 361/748 |
| 4,950,169 A | * | 8/1990 | Martin et al. | 439/44 |
| 5,139,924 A | * | 8/1992 | Svensson | 430/314 |
| 5,160,276 A | * | 11/1992 | Marsh et al. | 439/502 |
| 5,230,633 A | * | 7/1993 | Hisatomi et al. | 439/79 |
| 5,359,495 A | * | 10/1994 | Margalit et al. | 361/760 |
| 5,383,095 A | * | 1/1995 | Korsunsky et al. | 361/785 |
| 5,408,386 A | * | 4/1995 | Ringer et al. | 361/785 |
| 5,484,965 A | * | 1/1996 | Woychik | 174/262 |
| 5,549,479 A | * | 8/1996 | Elco et al. | 439/67 |

(List continued on next page.)

OTHER PUBLICATIONS

IBM Technical Disclosure Bulletin vol. 4 No. 3 Aug. 1961, p. 29 by Adams et al.*

Primary Examiner—Carl J. Arbes
(74) Attorney, Agent, or Firm—Philip R. Wadsworth; Charles D. Brown; Howard H. Seo

(57) ABSTRACT

A first printed wiring board (PWB, 102) has a first set of parallel printed wires (108) on one face and a second set of parallel printed wires (214) on the other face. The second set is generally orthogonal to the first set. The first set terminates in a first adaptor (110), which adapts to an interface (1034) having many parallel channels. The second set terminates in a second adaptor (112), which adapts to a second PWB (1036). Development of the second PWB is enhanced when any input or output on the second PWB can be connected to any channel of the interface. Thus, a hole is drilled through the first PWB at the intersection of the appropriate printed wires of the first and second sets, and is plated. The plated hole (416) may be drilled out (rendering it non-conductive) and effectively replated many times. Alternatively, the (inexpensive) first PWB may be replaced.

10 Claims, 4 Drawing Sheets

U.S. PATENT DOCUMENTS

| | | | |
|---|---|---|---|
| 5,587,890 A | * 12/1996 | Happ et al. | 361/826 |
| 5,600,102 A | * 2/1997 | Socha | 174/261 |
| 5,768,777 A | * 6/1998 | Lemke | 29/882 |
| 5,844,783 A | * 12/1998 | Kojima | 361/777 |
| 5,878,487 A | * 3/1999 | McMillan, II et al. | 29/852 |
| 5,895,278 A | * 4/1999 | Humphrey | 439/101 |
| 5,923,529 A | * 7/1999 | Mimachi | 361/684 |
| 5,999,097 A | * 12/1999 | Liddle et al. | 340/550 |
| 6,045,371 A | * 4/2000 | Kagawa et al. | 439/74 |
| 6,085,416 A | * 7/2000 | Ikeda | 29/864 |
| 6,099,354 A | * 8/2000 | Troyan | 439/638 |
| 6,128,201 A | * 10/2000 | Brown et al. | 361/784 |
| 6,139,360 A | * 10/2000 | Hayashi et al. | 439/502 |

\* cited by examiner

BIDIRECTIONAL INTERFACE TOOL FOR PWB DEVELOPMENT

TECHNICAL FIELD

This invention relates to printed wiring boards (PWBs), and has particular relation to apparatus and methods for developing PWBs for systems.

BACKGROUND ART

A printed wiring board (PWB) is generally part of a larger system. Development of the PWB generally runs concurrently with development of the remainder of the system. It often happens that a step in the development of the system does not require any change in the components or function of the PWB, but does require a change in the interface between the PWB and remainder of the system. For example, the interface may be the terminal of a cable with dozens of separate wires, each of which connects to a separate pin on the PWB. On the PWB, the component which used to connect with pin A now must connect to pin B, another component which used to connect with pin B must now connect to pin C, and a third component which used to connect with pin C must now connect to pin A. This pin reconfiguration is required by the reconfiguration of whatever device the other end of the cable was connected to.

When the user makes the next iteration of the system under development, he must prototype the entire system, and that means that he must prototype the PWB. The new prototype of the PWB has the same components and function as the previous prototype, and yet the (expensive) old prototype must be discarded and an (expensive) new prototype must be built, even though the only difference is a pin reconfiguration. This seems wasteful, but has been accepted as a necessary part of PWB development.

BRIEF DISCLOSURE OF THE INVENTION

Applicant has eliminated this waste with a bi-directional interface tool. A first printed wiring board (PWB) has a first set of parallel printed wires on one face and a second set of parallel printed wires on the other face. The second set is generally orthogonal to the first set. The first set terminates in a first adaptor, which mates with an interface (such as the plug or socket, or other terminal, of a cable) having many parallel channels (such as wires). The second set terminates in a second adaptor, which mates with a second PWB. Alternatively, the first adaptor mates with a third adaptor on the second PWB, and the second adaptor mates with a fourth adaptor on the second PWB.

Development of the second PWB is enhanced when any input or output on the second PWB can be connected to any channel of the interface. Thus, a hole is drilled through the first PWB at the intersection of the appropriate printed wires of the first and second sets, and is plated. The plated hole may be drilled out (rendering it non-conductive) and effectively replated (or, preferably, filled or refilled) many times. Alternatively, the (inexpensive) first PWB may be replaced.

DETAILED DESCRIPTION OF THE PREFERRED EMBODIMENT

Figure 1:
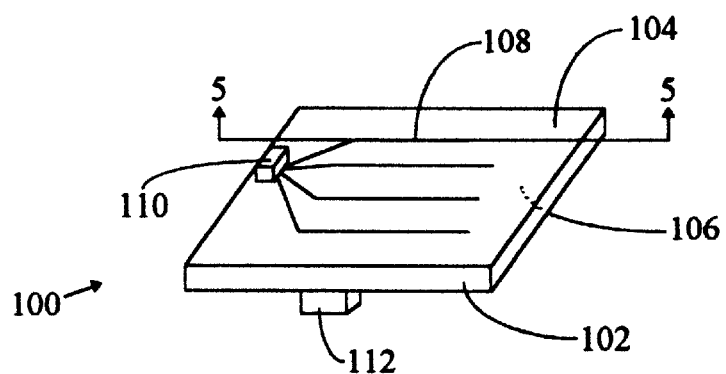
FIG. 1 is a top perspective view of the present invention.

FIG. 1 is a top perspective view of the interface tool (100) of the present invention. A first printed wiring board (PWB) (102) has a first (top) face (104) and a second (bottom) face (106). A first set of generally parallel printed wires (108) on the top face terminates into a first adaptor (110). The first adaptor is constructed to mate with an interface, such as the terminal of a cable (1034) (see FIG. 10), or such as a third adaptor (1110) on the second PWB (1036) (see FIG. 11). The bottom face (106) supports a second adaptor (112), described in greater detail below.

Figure 2:
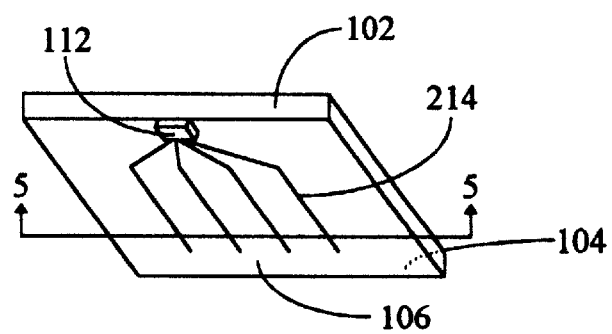
FIG. 2 is a bottom perspective view of the present invention.

FIG. 2 is a bottom perspective view of the present invention. A second set of generally parallel printed wires (214) terminates into the second adaptor (112). The second adaptor is constructed to mate with a second PWB (1036) (see FIG. 10).

Figure 3:
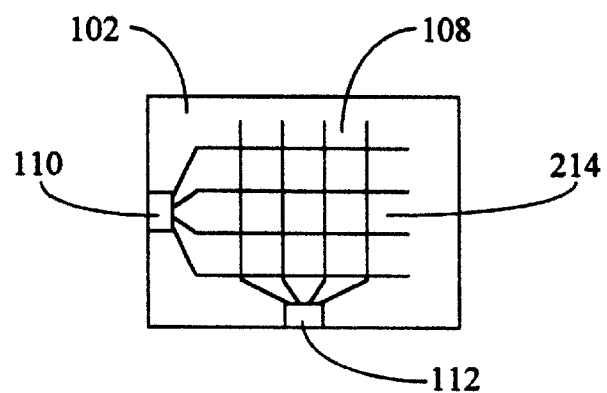
FIG. 3 is a top plan view of the present invention.

FIG. 3 is a top plan view of the present invention. Both faces are shown.

Figure 4:
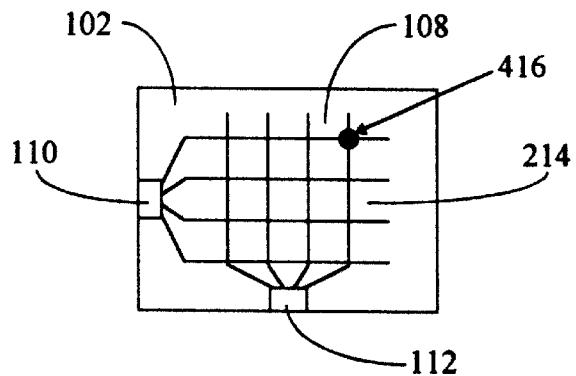
FIG. 4 is a top plan view of the present invention, further showing a connection hole.

FIG. 4 is a top plan view of the present invention, further showing a connection hole (416). It is drilled through a first printed wire (108) on the top face of the first printed wiring board (PWB) (102) and a second printed wire (214) on the bottom face of the PWB.

Figure 5:
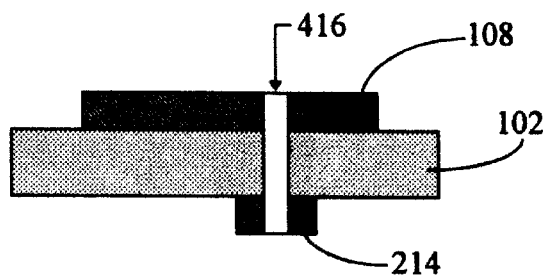
FIG. 5 is a cross section of the hole of FIG. 4, taken along lines 5—5 of FIGS. 1 and 2.

FIG. 5 is a cross section of the hole (416) of FIG. 4, taken along lines 5—5 of FIGS. 1 and 2. The hole is made narrower that either the first or second printed wires (108) (214), so that it can make good electrical contact with both of them.

Figure 6:
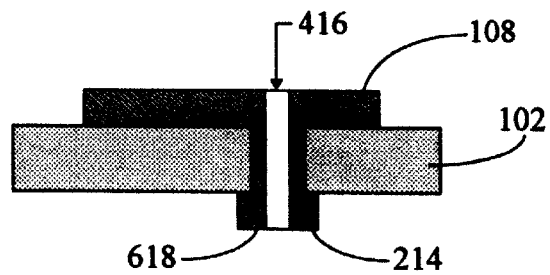
FIG. 6 is a cross section view of the hole of FIG. 5, made conductive by plating.

FIG. 6 is a cross section view of the hole of FIG. 5, made conductive by plating the hole with a conductive material (618).

Figure 7:
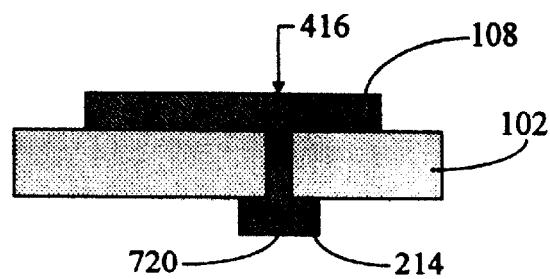
FIG. 7 is a cross section view of the hole of FIG. 5, made conductive by filling.

FIG. 7 is a cross section view of the hole of FIG. 5, made conductive by filling the hole with a conductive material (720).

Figure 8:
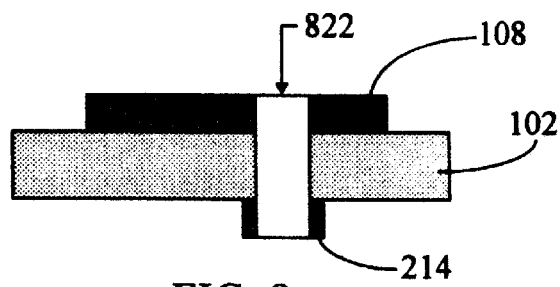
FIG. 8 is a cross section view of the holes of FIG. 6 or 7, made non-conductive by drilling out.

FIG. 8 is a cross section view of the holes of FIG. 6 or 7, made non-conductive by drilling out. The resulting hole (822) is wider than the original hole (416), but is also made narrower that either the first or second printed wires (108, 214). Thus, it also can make good electrical contact with both printed wires if the resulting hole (822) is re-plated or re-filled. Alternatively, the first PWB (102) may be discarded and replaced.

Figure 9:
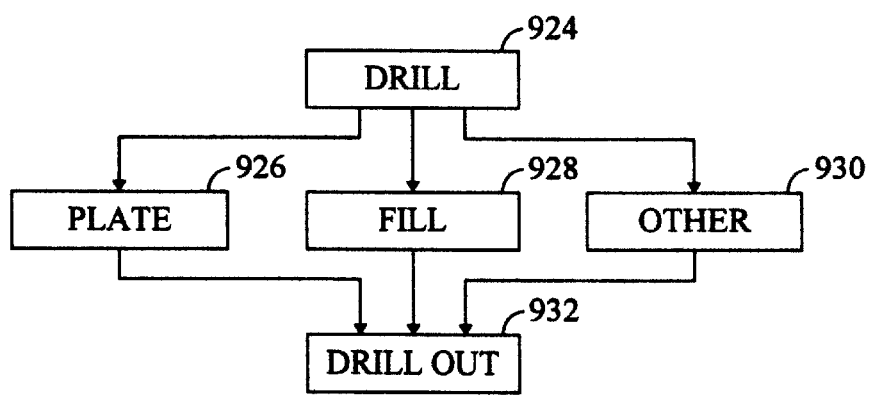
FIG. 9 is a flow chart of a method for customizing the invention of FIG. 1.

FIG. 9 is a flow chart (900) of a method for customizing the invention of FIG. 1. A hole is drilled (924) through the first printed wiring board (PWB, 102) at the intersection of the first printed wire (108) and the second printed wire (214). Rendering the hole conductive, as by plating (926), filling (928), or any other convenient method (930), connects the two printed wires. Drilling out (932) the conductive hole may disconnect the two printed wires.

Figure 10:
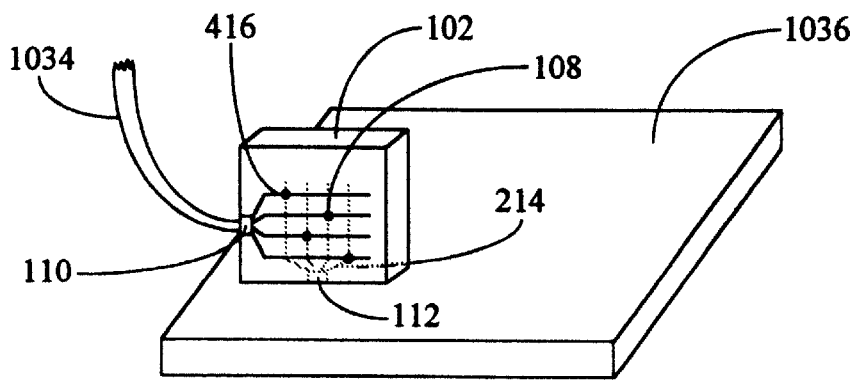
FIG. 10 is a perspective view of one embodiment of the present invention in use.

FIG. 10 is a perspective view of one embodiment of the present invention in use. The tool (100) has its first adaptor (110) mated onto a cable (1034), which is the preferred form of interface to the remainder of the system. It has its second adaptor (112) mated onto a second printed wiring board (PWB, 1036). In FIG. 10, there are an equal number of printed wires in the first set of printed wires (108) as in the second set of printed wires (214). Moreover, each printed wire in the first set of printed wires is connected to exactly one printed wire in the second set of printed wires. Thus, each pin on the second PWB (1036) may be connected with any wire in the cable (1034). When it becomes necessary to re-prototype, it is not necessary to build an entire new second PWB (1036), but only a new (and much less expensive) tool (100). Indeed, the old tool may be re-used through the simple expedient of drilling out the unwanted connections and plating or filling in new connections. Further, the tool is truly bi-directional, which has not been the case with prior devices.

Figure 11:
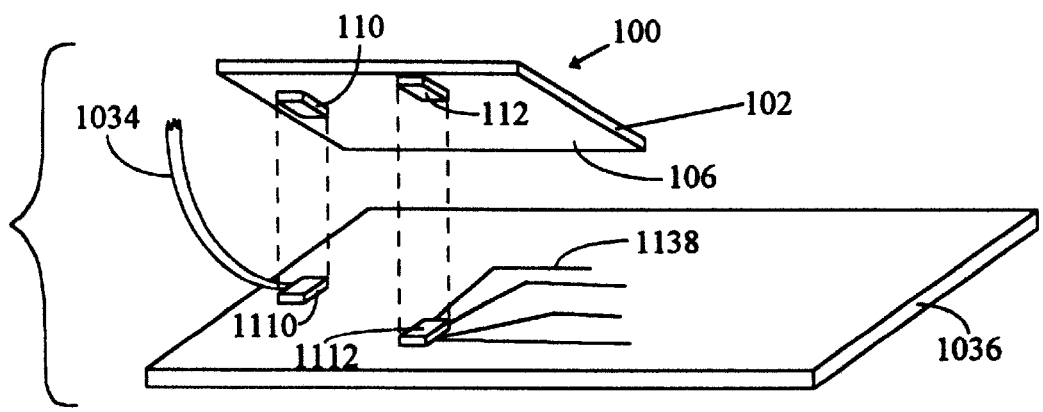
FIG. 11 is a perspective view of a second embodiment of the present invention in use.

FIG. 11 is a perspective view of a second embodiment of the present invention in use. Both the first adaptor (110) and the second adaptor (112) are shown on the bottom face (106) of the first PWB (102). The first adaptor (110) mates with a third adaptor (1110) on the second printed wiring board (PWB, 1036), and the third adaptor is connected to the cable (or other interface) (1034). The second adaptor (112) mates with a fourth adaptor (1112) on the second PWB (1036), and the fourth adaptor (1112) is connected to printed wires (1138) on the second PWB (1036).

Figure 12:
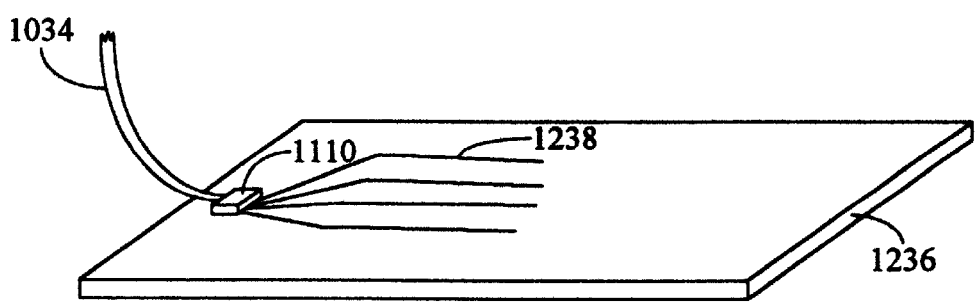
FIG. 12 is a perspective view of the developed PWB after the use of the second embodiment has been completed.

FIG. 12 is a perspective view of the developed second printed wiring board (PWB, 1036) after the use of the second embodiment of the present invention has been completed. Once several iterations of the tool (100) have been used, and development of the remainder of the system is complete, the assignment of wires within the cable (1034) is fixed. A final prototype of the second PWB (1236) is made, with the printed wires (1138) being finalized as finalized printed wires (1238). The finalized printed wires (1238) go directly to the third adaptor (1110). The fourth adaptor (1112) of FIG. 11 is not carried forward into FIG. 12. The tool (100) is also omitted, it having served its purpose in the development of the developed second printed wiring board (PWB, 1036). Thus, only two versions of the second PWB (1036) need be prototyped: the version of FIG. 11 and the version of FIG. 12.

It is often more convenient not to make a developed second printed wiring board (PWB, 1236), and simply to use the tool (100) in conjunction with the undeveloped second PWB (1036) on a long-term basis. This is an especially productive strategy when several related systems are to be used, and the same second PWB (1036) can be used in all of them—except for the fact that pin assignments are different. In this case, a single version of the (expensive) second PWB is manufactured in a long production run. Multiple versions of the (inexpensive) tool are manufactured, in shorter production runs. In this way, the fixed costs of the second PWB are spread out over larger quantities of the system(s) as finally sold.

Figure 13:
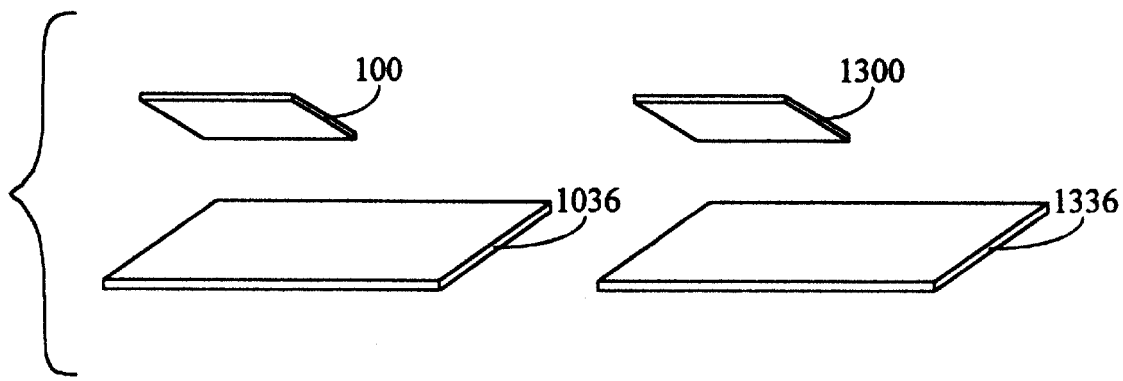
FIG. 13 shows multiple versions of the interface tool.

FIG. 13 shows multiple versions of the interface tool. The interface tool (100) is now a first interface tool, and there is a second interface tool (1300) associated with it. The second interface tool has a first-printed-wire/second-printed-wire pair which differs from the first-printed-wire/second-printed-wire pair of the first interface tool. The first interface tool (100) is mated with the second PWB (1036). The second interface tool (1300) is mated with a third PWB (1336) of the same design as the second PWB (1036).

Industrial Application

My invention is capable of exploitation in industry, and can be made and used, whenever it is desired to rapidly prototype a printed wiring board. The individual components of the apparatus and method shown herein, taken separate and apart from one another, may be entirely conventional, it being their combination which I claim as my invention:

While I have described various modes of apparatus and method, the true spirit and scope of my invention are not limited thereto, but are limited only by the following claims and their equivalents, and I claim such as my invention.

What is claimed is:

1. A method for creating interface wiring on a printed wiring board (PWB) by using an interface tool, the PWB having a first adaptor with pins for connecting to an outside circuit and a second adaptor with pins for connecting to the interface tool, and the interface tool having a first face with first parallel printed wires, a second face with second parallel printed wires orthogonal to the first printed wires, a third adaptor and a fourth adaptor, said method comprising the steps of:
    (a) determining wiring connections between the pins of the first adaptor and the pins of the second adaptor;
    (b) connecting the first adaptor to the third adaptor and connecting the second adaptor to the fourth adaptor;
    (c) drilling a hole through the interface tool at an intersection of one of the first printed wires and one of the second printed wires;
    (d) making the hole conductive based on the determined wiring connections; and
    (e) repeating steps (c) and (d) to complete the determined wiring connections,
    wherein the determined wiring connections between the pins of the first adaptor and the pins of the second adaptor are created through the conductive holes made in step (d).

2. The method of claim 1, further comprising the steps of:
    removing the interface tool; and
    creating direct wire lines between the first adaptor and the second adaptor based on the determined wiring connections.

3. The method of claim 2, further comprising the step of: removing the second adaptor.

4. The method of claim 1, wherein the hole is made conductive by plating the hole with a conductive material to connect one of the first printed wires with one of the second printed wires.

5. The method of claim 1, wherein the hole is made conductive by filling the hole with a conductive material to connect one of the first printed wires with one of the second printed wires.

6. The method of step 1, further comprising the step of:
    disconnecting one of the conductive holes by drilling out the conductive hole.

7. A method for creating interface wiring on a printed wiring board (PWB) by using an interface tool, the PWB having a first adaptor with pins for connecting to the interface tool, and the interface tool having a first face with first parallel printed wires, a second face with second parallel printed wires orthogonal to the first printed wires, a second adaptor and a third adaptor for connecting to an outside circuit, said method comprising the steps of:
  (a) determining wiring connections between the pins of the first adaptor and the pins of the third adaptor;
  (b) connecting the first adaptor to the second adaptor;
  (c) drilling a hole through the interface tool at an intersection of one of the first printed wires and one of the second printed wires;
  (d) making the hole conductive based on the determined wiring connections; and
  (e) repeating steps (c) and (d) to complete the determined wiring connections,
  wherein the determined wiring connections between the pins of the first adaptor and the pins of the third adaptor are created through the conductive holes made in step (d).

8. The method of claim 7, wherein the hole is made conductive by plating the hole with a conductive material to connect one of the first printed wires with one of the second printed wires.

9. The method of claim 7, wherein the hole is made conductive by filling the hole with a conductive material to connect one of the first printed wires with one of the second printed wires.

10. The method of step 7, further comprising the step of:
  disconnecting one of the conductive holes by drilling out the conductive hole.

* * * * *